INVENTORS:
KENNETH K. CAMPBELL, JR.
HEINRICH F. MEYER,
BY C. W. Baker
THEIR ATTORNEY.

Dec. 23, 1969 K. K. CAMPBELL, JR., ET AL 3,484,937

METHODS AND APPARATUS FOR FIXING INTERFACE PINS IN ELECTRICAL CIRCUIT BOARDS

Filed Aug. 29, 1967 3 Sheets-Sheet 2

INVENTORS:
KENNETH K. CAMPBELL, JR.
HEINRICH F. MEYER,

BY C. W. Baker
THEIR ATTORNEY.

INVENTORS:
KENNETH K. CAMPBELL, JR.
HEINRICH F. MEYER,

BY C. W. Baker
THEIR ATTORNEY.

United States Patent Office 3,484,937

Patented Dec. 23, 1969

3,484,937

METHODS AND APPARATUS FOR FIXING INTERFACE PINS IN ELECTRICAL CIRCUIT BOARDS

Kenneth K. Campbell, Jr., and Heinrich F. Meyer, Liverpool, N.Y., assignors to General Electric Company, a corporation of New York Filed Aug. 29, 1967, Ser. No. 664,123
Int. Cl. H01r *9/00*
U.S. Cl. 29—630 7 Claims

ABSTRACT OF THE DISCLOSURE

Methods and apparatus are disclosed for fixing interface pins in electrical circuit boards to provide interconnection between circuits on their opposite sides. In the methods described a hole preformed in the board has inserted therethrough a soft wire pin of slightly smaller diameter and substantially greater length than the hole; then, while containing radial expansion of the projecting end portions of the pin, the pin is longitudinally compressed to upset its center portion radially outwardly into secure engagement with the hole walls. Apparatus described for performing this operation includes means for cutting pins to proper length from wire stock, means providing containment for the pin ends, means for longitudinally compressing the pin with its ends thus contained to expand its center portion outwardly to engage the hole through which inserted, and control means for automatically sequencing these steps in proper order and time.

BACKGROUND OF THE INVENTION

This invention relates generally to electrical circuit boards and more specifically to methods and apparatus for inserting and fixing interface pins in such boards for interconnecting circuit runs or conductors on opposite sides of the board. The need for such interface connection occurs frequently where it is necessary to maximize component density on circuit boards and also in applications in which circuit runs on both sides of the board are required in order to avoid crossing of runs which would otherwise require jumpering or lamination in order to separate the crossed runs. An obvious solution to this problem of providing interface connection through the board is to drill a hole between the two opposed runs to be connected, then provide electrical connection through the hole either by plating copper into the hole, by inserting an eyelet or rivet through the hole and upsetting its heads over into contact with the circuit runs, or by inserting a wire pin through the hole with its opposite ends projecting from the hole so as to be solderable to the two circuit runs through which it projects. Interface connectors of this last type serve very satisfactorily in most applications and consequently have found wide use.

In order to fasten such interface pins securely in place in the board holes into which inserted, the preferred practice is to make the pins of diameter slightly greater than the predrilled board holes into which they are to be inserted, and then force fit the pins into the holes. In this way the pins may be held reliably in place during the soldering operation and any other assembly operations which may follow insertion of the pins. This necessary interference fit between pin and board may give rise to problems, however, in applications where the copper wire from which the pins commonly are cut is not sufficiently strong to enable forcing of pins through the board and into interference fit therewith. For example, if the board is fabricated of fiberglass or other very hard material it may not be possible to press fit pins into the board at least not without requiring extremely close tolerance on pin and hole diameters so as to assure that each pin is only very slightly oversize, and uniformly so, with respect to hole diameter. Also, similar problems may arise even with phenolic or other relatively softer boards in cases where the pins are to be of extremely small diameter as often used in miniaturized circuits; such small diameter wire may lack sufficient strength to enable its press fit into the board holes.

The present invention has as its principal objective the provision of interface pin insertion methods and apparatus which are capable of providing satisfactory service even in problem applications such as just outlined, and which at the same time is of general utility in a wide variety of other interface pin applications. In addition to its capability of handling small diameter pins and fiberglass or other high strength board materials, the methods and apparatus of this invention afford such other advantages as reduced likelihood of disturbance of circuit runs on insertion of the pins therethrough, and easier and more precise location of the pin with respect to the hole through which inserted.

SUMMARY

In brief, the present invention is directed to methods and apparatus for inserting and fixing interface pins through electrical circuit boards with the opposite ends of the pins left projecting above the board surfaces so as to enable soldering to circuit runs on opposite sides of the board. In accordance with the invention, the pins are cut from soft copper wire of diameter slightly smaller than the board holes and of length substantially greater than the board thickness. The pin thus constituted is inserted through the board hole and then, while containing radial expansion of the projecting end portions of the pin, the pin is longitudinally compressed to upset its center portion radially outwardly into secure engagement with the hole walls, to thus firmly fix the pin in the hole with its opposite ends left projecting above the adjacent surfaces of the board.

In the preferred apparatus for performance of this method the wire stock from which the pins are cut is unreeled from a spool and passed through feed means which serve to advance the wire stock through a fixed anvil member to a point such that the free end of the wire projects some small distance beyond the anvil member. A second movable anvil member engages the free end of the wire after insertion through the board hole, and moves toward the fixed anvil member to compress the wire between them. Just before this occurs, the pin is cut to length by a plunger the cutting end of which reciprocates in a cross hole through the fixed anvil member, to cut the wire to proper pin length and to provide a backing member against which the pin may seat when the two anvil members come together to compress the pin. After the pin is compressed the plunger then retracts to enable feed of another length of wire through the upper anvil member by operation of the wire feed means, this and the other operations of the apparatus being properly sequenced in order and time preferably by automatic control means. Such automatic means conveniently may include means for automatically initiating the operating cycle upon insertion of the free end of the wire through the board hole to be pinned and movement of the board into proximity with the fixed anvil member by the operator.

BRIEF DESCRIPTION OF THE DRAWINGS

Other features, objects and advantages of the invention will become more fully apparent and the invention will be further understood by reference to the following detailed description when read in conjunction with the accompanying drawings, wherein.

DESCRIPTION OF PREFERRED EMBODIMENTS

Figure 1:
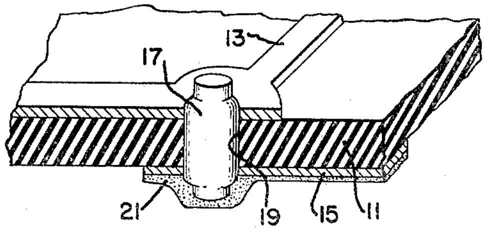
FIGURE 1 is a sectional view through a double sided circuit board having an interface pin fixed therein in accordance with the methods and apparatus of this invention.

With continued reference to the drawings, wherein like reference numerals have been used throughout to designate like elements, FIGURE 1 illustrates a fragment of electrical circuit board into which an interface pin has been inserted and fixed in accordance with the methods and by use of the apparatus of this invention. As shown, the board 11 may be of fiberglass impregnated cloth or other suitable material and has electrical circuit runs or conductors 13 and 15 carried on opposite faces of the board. These conductors may be applied by electrodeposition or other conventional processes for application of circuit runs to printed circuit boards.

To provide interconnection between the circuit runs 13 and 15, an interface pin 17 is inserted through a drilled or otherwise preformed hole 19 through the board, with the pin ends projecting beyond the board contiguous to the two circuit runs which the pin interconnects. When solder subsequently is applied to this connection, as by flow soldering or other conventional soldering operation, the solder flows over the projecting ends of the interface pin 17 and the adjacent circuit run as shown at 21, to provide good electrical interconnection between the pin and circuit run.

In accordance with the invention, in order to provide the desired mechanical connection between the pin 17 and board 11, the pin is cut from soft copper wire of diameter approximately equal to the diameter of the projecting end portions of the pin 17 in FIGURE 1, which diameter is at least slightly smaller than that of the preformed hole 19 through the board 11. The pin blank is inserted into the hole, the pin ends contained to limit radial expansion thereof, and the pin then longitudinally compressed to expand its center portion radially outwardly into firm engagement with the walls of the hole 19 as shown. The extent of this longitudinal compression and radial expansion of the pin 17 will depend upon the particular board material being used but is made such that the mechanical interconnection between pin and board is of adequate strength to assure retention of the pin properly positioned in the hole through subsequent assembly operations and until solder is applied to the pin ends.

Figure 2:
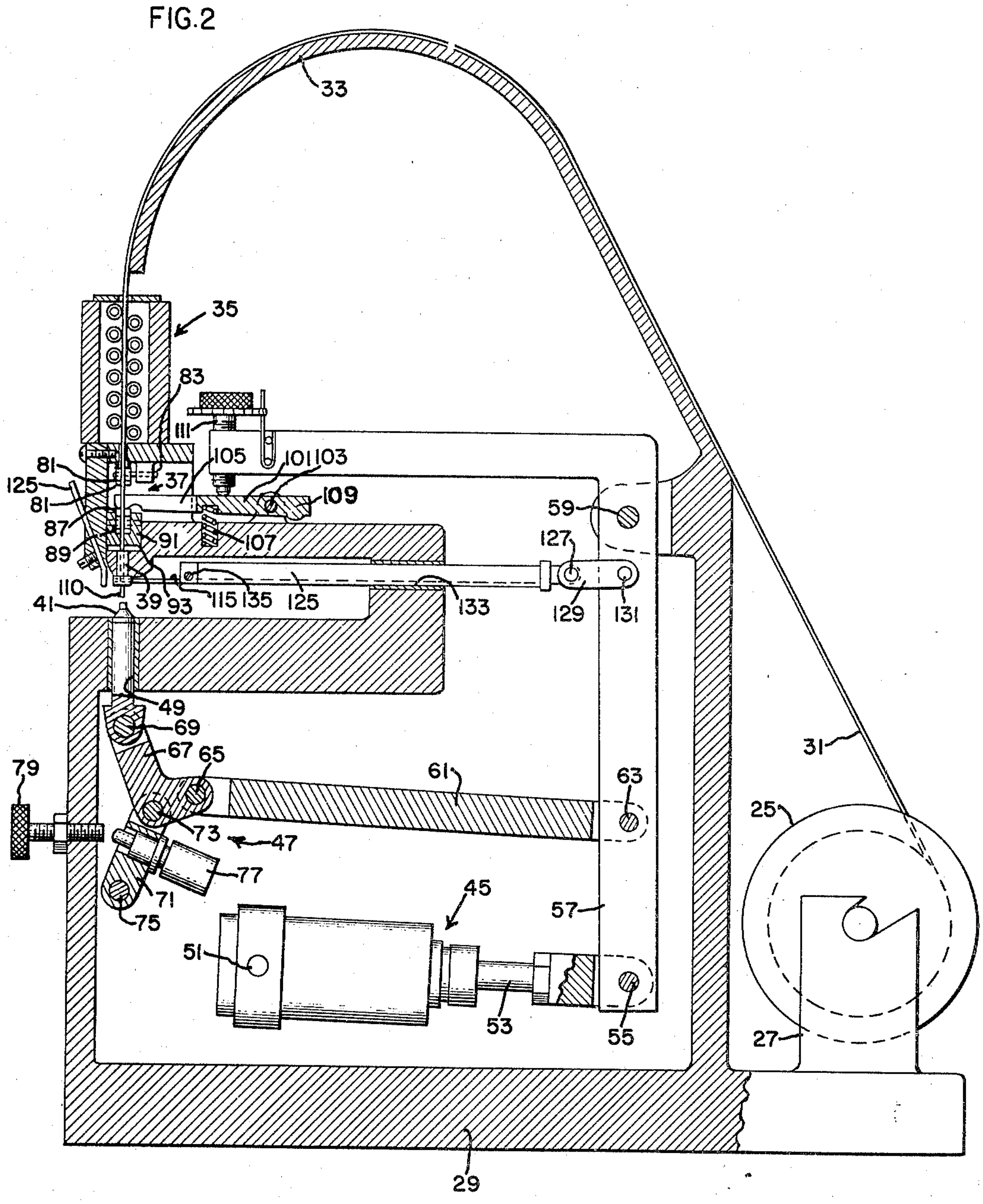
FIGURE 2 is a part sectional view of apparatus for inserting and fixing interface pins in electrical circuit boards in accordance with the invention.

FIGURE 2 illustrates one embodiment of apparatus for inserting interface pins in accordance with the methods just explained. As shown in FIGURE 2, the interface pin machine of this invention may conveniently be of bench size with each machine supplied with wire stock from a spool 25 rotatable in a spool bracket 27 fixed to the machine frame 29. The wire 31 unreeling from spool 25 passes upwardly over a guide or shroud member 33 fixed to or formed integrally with the machine frame 29, thence downwardly through a wire straightener assembly designated generally by reference numeral 35, through wire advancing means designated generally by reference numeral 37, through an upper anvil member 39 and into alinement with a lower anvil member 41. The electrical circuit board to be pinned is inserted between these two anvil members and the pinning operation then accomplished as explained hereinafter.

Figure 4:
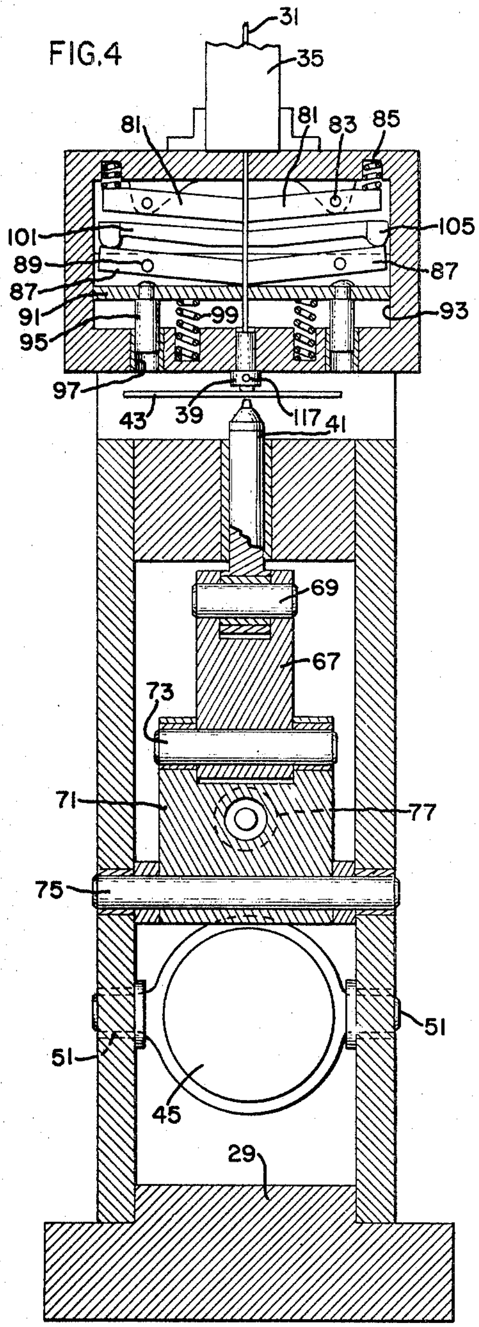
FIGURE 4 is a part sectional view taken along the line 4—4 in FIGURE 3.

As previously noted, the pinning operation involves a longitudinal compression of the pin blank between the two anvil members, and to accomplish this there is provided a pneumatic actuator assembly designated generally by reference numeral 45 which operates through mechanical linkage designtaed generally by reference numeral 47 to effect a vertical reciprocation of the lower anvil member 41 within a vertical bore 49 through the machine frame 29. As best shown in FIGURES 2 and 4, the pneumatic actuator 45 is trunnion mounted as at 51 to the machine frame, and the actuator output rod 53 is pivotally connected as at 55 to an actuating member 57 which is of the L configuration shown and pivotally mounted to the machine frame as at 59. Actuating arm 57 accordingly may rotate about the axis of this pivot 59 upon linear movement of the actuator output rod 53, the necessary accompanying pivotal movement of the linear actuator 45 being permitted by its trunnion mounting 51.

The mechanical linkage 47 which couples actuating arm 57 to anvil member 41 comprises an operating arm 61 having one end pivotally connected as at 63 to the actuating arm member 57, and having its other end also pivotally connected as at 65 to one end of a floating bell crank member 67 the remote end of which is pivotally connected as at 69 to the lower end of the anvil member 41. Bell crank 67 has floating connection to the machine frame through a link 71 pivotally connected as at 73 to the bell crank center and as at 75 to the frame 29. Operation of the linkage mechanism just described may perhaps best be understood by comparison of FIGURES 2 and 3, which respectively show the two extremes of movement of this linkage and the relative positions of the anvil member 41 at these two extremes of movement.

The maximum permitted range of movement of the lower anvil member 41 in upward direction may desirably be made adjustable in order to accommodate circuit boards of different thicknesses, and in order to provide this control there is included a pneumatic pilot valve 77 carried by link 71 and adjustable stop means 79 fixed to the machine frame. Stop 79 provides a mechanical limit on movement of the linkage mechanism in pin setting direction, and at the same time trips pilot valve 77 for reversal of the direction of drive of the pneumatic actuator in a manner to be explained hereinafter.

Actuating arm 57 also drives the wire advance mechanism 37 so that once during each operating cycle a length of wire stock is fed downwardly through the wire straightener unit 35, which may be of the conventional construction shown, and through the upper anvil member 39. To provide this feed, the wire advance mechanism 37 includes a pair of antireverse fingers 81 pivotally mounted as at 83 to the machine frame and having their adjacent ends urged upwardly into engagement with each other by a pair of downwardly acting loading springs 85 disposed outwardly of their pivot axes as shown. The wire stock 31 may freely move downwardly between the antireverse fingers 81, but movement in the reverse direction is proscribed by the pinching and clamping operation of the antireverse assembly.

The desired downward advance of the wire stock is accomplished by a second pair of fingers 87 pivotally mounted as at 89 to a carrier member 91 which is mounted for vertical sliding movement in a slot 93 provided in the machine frame. Movement of carrier member 91 is constrained by a pair of guides 95 slidable in bores 97 in the machine frame, and the carrier member is urged upwardly by a pair of springs 99 compressed between the carrier member and the frame. The finger and carrier member assembly may be forced downwardly against the urging of springs 99 by a fork arm 101 pivotally mounted as at 103 to the machine frame and having its fork ends 105 operatively engaging the extreme outer ends of the fingers 87 as shown. Fork arm 101 is urged upwardly by a spring 107 compressed between it and the frame, but is limited in its range of movement responsive to this urging by engagement of its end 109 with the frame. Downward movement of the fork arm 101 is effected by the actuating arm 57, through adjustable stop means 111 for controlling the point of contact with the fork arm 101 and thus controlling its stroke and the distance through which the wire stock is advanced during each operating cycle.

In operation of the wire advance mechanism just described, a downward movement of fork arm 101 accomplished by counterclockwise rotation of actuating arm 57 about its pivot 59 will first cause the fingers 87 to rotate about their pivots 89 in directions such as to force their adjacent ends together and clamp the wire firmly between them. With the wire thus securely clamped with respect to the fingers 87 and through it to the carrier member assembly, further downward movement of fork arm 101 will cause downward movement of carrier member 91 thus advancing a length of wire downwardly through the upper anvil member 39. The magnitude of this movement, and consequently the length of wire as shown at 110 projecting downwardly below the upper anvil member 39 upon the completion of this operation, depends upon the setting of the adjustable top member 111 previously described.

Figure 3:
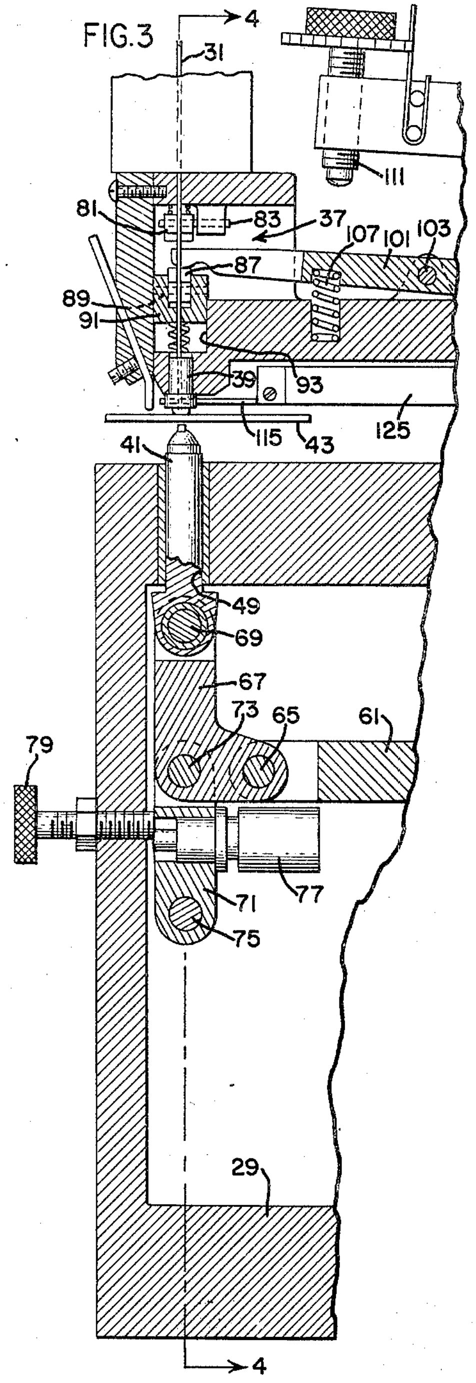
FIGURE 3 is a fragmentary sectional view similar to FIGURE 2 but showing the parts in moved position.

After this movement the parts occupy positions as shown in FIGURE 2, and will remain in such positions until another operating cycle is initiated by the operator in the manner to be explained hereinafter. The parts then move to positions as shown in FIGURE 3. During this movement, the clamping of wire 31 between fingers 87 is released because the fork member 101 no longer is bearing down on the extreme outer ends of these fingers 87, so the finger and carrier assembly may move upwardly without carrying the wire along with it. The wire accordingly may be held against such reverse movement by the antireverse fingers 81 which under these conditions clampingly engage the wire by reason of their spring loading at 85.

Figure 5:
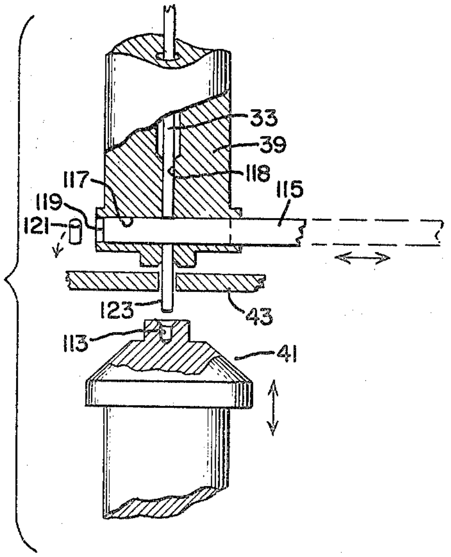
FIGURE 5 is a fragmentary detailed view of the anvil and plunger assembly of the apparatus of FIGURES 2–4 shown to enlarged scale.

Referring now to FIGURE 5, this illustrates the upper and lower anvil members in the same relative positions as shown in FIGURE 2 but to enlarged scale. The lower anvil member 41 is shown provided with a closed end hole or blind bore as at 113 for receiving the lower end of the pin blank and limiting its radial expansion on compression of the pin. As illustrated, the upper anvil member 39 is provided with wire cutting mechanism for cutting, from the wire stock 31, pin blanks of length appropriate to the board thickness and other requirements of the particular application. This cutter mechanism comprises a plunger 115 reciprocable in a cross bore 117 which intersects the longitudinal bore 118 through which travels the wire stock 31 and is of at least equal diameter. Plunger 115 reciprocates between a first or retracted position in which the plunger is withdrawn so as to permit the wire 31 to advance downwardly through the bore 118, to a second or forward position in which the plunger is fully inserted. In traveling to this second position, plunger 115 cuts two lengths from the wire stock 33 and ejects one piece of wire thus cut outwardly through the open end of the cross bore 117 in which the plunger reciprocates, the ejected bit of wire being shown as at 121. Plunger 115 serves also to block the bore 118 through which wire 31 advances and thus defines with bore 118 a closed end hole in which seats the pin blank 123 constituted by the other piece of wire cut by the plunger.

In order to provide the necessary reciprocating motion of cutter plunger 115 in properly timed relation to the anvil member movement, the plunger 115 is connected for actuation by the same actuating arm member 57 as drives the lower anvil member. Such connection is afforded as shown in FIGURE 2 by a rod 125 pivotally connected as at 127 to a link 129 and through it to the actuating arm 57 as at 131. Rod 125 slides in a journal 133 in the machine frame and at its free end includes clamp means 135 adapted to releasably and adjustably secure the end of the cutting plunger 115 as shown.

Operation of the machine is believed obvious from what has already been said regarding its construction. In brief, the parts move between a first or loading position shown in FIGURE 2 to a second position as shown in FIGURE 3 in which the pin is fully compressed preparatory to reset back to the loading position of FIGURE 2. The single pneumatic actuator 45 provides the driving force for all required movement, and proper sequencing of the steps of wire stock advance, wire cutoff, and pin compression is assured by the mechanical arrangement and interconnection of parts in the manner described.

While it would be possible to manually control the air supply to the pneumatic actuator 45 with manual manipulation of such control by the operator, it generally will be preferred to provide at least semiautomatic control. To this end, the machine preferably incorporates sensor means for detecting the insertion of a circuit board into place between the anvil members for initiating the pin settting cycle, and automatic means operative on completion of this cycle for restoring the machine to loading position. As shown in FIGURES 2 and 3 such detector may take the form of a tube 125 having its end positioned as shown adjacent the upper anvil member 39 so that when an electrical circuit board 43 is inserted into place against the anvil member the board at least partially blocks the open or nozzle end of this tube. Such blockage then may trigger an operating cycle through appropriate connection into the pneumatic supply and control system shown schematically in FIGURE 6, to which reference is now made.

Figure 6:
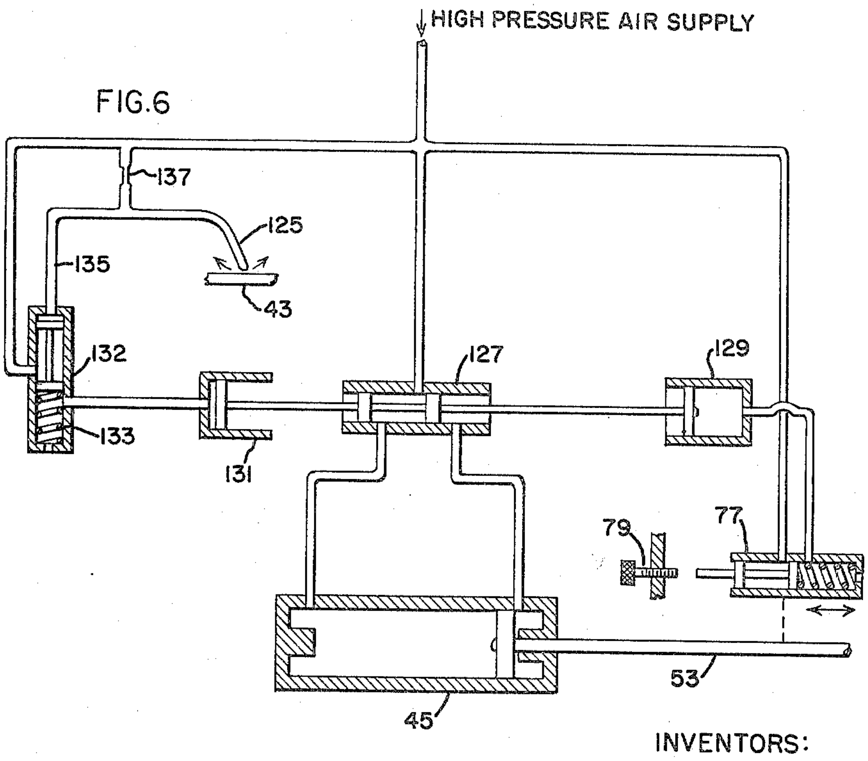
FIGURE 6 is a schematic diagram of pneumatic actuator and control means suitable for use with the interface pin apparatus of FIGURES 2–5.

In FIGURE 6, the high pressure air supply connects to one end or the other of the cylinder of pneumatic actuator 45 depending upon the position of a spool valve 127 which is positioned by two valve operators 129 and 131 each under control of a pilot. The pilot for valve operator 129 is constituted by the pilot valve 77 previously mentioned, pilot valve 77 being connected to the high pressure air supply and to valve operator 129 in a manner such as to connect the high pressure air supply to the operator whenever the lever member 71 reaches the desired extreme of its movement. The pilot 132 for valve operator 131 is spring loaded as by a compression spring 133 in the direction shown, and may be driven in the reverse direction in opposition to this spring by increase of air pressure in a line 135 which connects it directly to the board sensor nozzle 125 and connects it through a restrictive orifice 137 to the high pressure air supply.

When no board 43 is sufficiently close to the nozzle opening of detector tube 125 to block outward flow of air therefrom, air pressure in line 135 remains close to atmospheric and spring 133 accordingly may hold the spool of valve 132 in the position illustrated, in which the high pressure air supply is cut off from both valve operators 129 and 131. The operating parts of the machine accordingly remain in the "load" positions shown in FIGURE 2. When a circuit board 43 is brought into place sufficiently close to block flow of air outwardly from the detector tube 125, as shown in FIGURE 3, the resultant increase in pressure in line 135 drives the spool of pilot valve 132 downwardly against the force of spring 133, and pilot 132 then connects the high pressure air supply to the valve operator 131, driving it and the attached spool valve 127 to the right so as to connect the air supply to the right-hand side of the main actuator 75. The actuator then strokes so as to drive the operating parts to the pin compressing or setting position shown in FIGURE 3.

During a first part of this stroke the cutter plunger 115 moves in leftward direction to cut two lengths from the wire stock, one length being a short waste piece which is ejected, and the other constituting the pin blank 123 which is then backed up by the plunger. The lower end of this blank is received in the lower anvil member as it rises, thus providing containment for both ends of the blank and limiting radial expansion during the compressing operation which follows. As the lower anvil member completes its travel it accomplishes the desired compression of the pin blank, upsetting its center portion radially outwardly into secure interengagement with the hole walls. The termination of this stroke is controlled by the setting of the adjustable stop means 79 for lever 71 and pilot valve 77, this adjustment being dependent on board thickness and set so as to assure that the lower anvil member does not drive into and injure the board.

The reverse stroke, which is enabled by pilot valve 77 striking the stop 79 and connecting high pressure air to valve operator 129, does not commence until valve operator 131 has been unloaded by venting to atmosphere through pilot valve 132. Such venting occurs when the operator removes the board 43 from adjacent the sensor nozzle 125, and results in the main actuator 45 being driven in a direction to restore the parts to the position shown in FIGURE 2. Near the end of this stroke, the free end of actuating arm 57 drives downwardly on fork arm 105 to advance another length of wire downwardly into position for insertion through the next board, thus completing one cycle of operation.

The operating adjustments provided by the stroke stop device 79 and by the wire advance control 111 enable accommodation to a wide range of board thicknesses and to other variables such as ratio of pin to hole diameters. Also, the anvil members 39 and 41 may be made readily removable in whole or in part, to enable quick conversion of the machine to accommodate wire stock of different diameters or to provide different lengths of pin end projection. The pin insertion machine of this invention thus affords good flexibility and versatility of application, in addition to the several other advantages previously explained. It will be appreciated that hydraulic or electrical actuation and control systems may be used if preferred to the pneumatic system shown, and that since the machine requires little drive power it may advantageously be manually actuated in some applications.

While in this description of the invention only certain presently preferred embodiments have been illustrated and described by way of example, many modifications will occur to those skilled in the art and it therefore should be understood that the appended claims are intended to cover all such modifications as fall within the true spirit and scope of the invention.

What is claimed as new and desired to be secured by Letters Patent of the United States is:

1. The method of providing electrical interconnection between conductors carried on opposite faces of an electrical circuit board, which comprises the steps of:
- (a) preforming through said board a hole having its opposite ends opening adjacent the conductors to be interconnected;
- (b) inserting a wire pin blank through said hole with its opposite ends left projecting therefrom;
- (c) longitudinally compressing the pin to expand its center portion radially outwardly into mechanical interengagement with the hole walls while containing the projecting end portions of the pin against radial expansion; and
- (d) applying solder to the projecting end portions of said pin and the adjacent conductors.

2. Apparatus for inserting and fixing interface pins in electrical circuit boards for interconnecting conductors on opposite sides thereof, comprising:
- (a) wire supply means providing pin stock from which pin blanks may be cut;
- (b) first and second anvil members disposed in opposed relation and including aligned closed end holes each of diameter such as to accommodate therein one end of said pin blank and to contain radial expansion thereof;
- (c) means for cutting pin blanks from said wire stock and positioning them for insertion through said circuit board and containment in said closed end holes in said anvil members; and
- (d) means for reciprocably moving said anvil members toward each other to compress said pin blank therebetween and thus to expand its center portion radially outwardly into engagement with the surrounding walls of said circuit board.

3. Apparatus as defined in claim 2 wherein said pin end containing hole in said first anvil member is constituted by a longitudinal bore through which said wire stock may feed and which is intersected by a cross bore of at least equal diameter, and wherein said cutting means comprises a plunger reciprocable in said cross bore between a retracted position in which the plunger unblocks said longitudinal bore to permit wire feed therethrough and a forward position in traveling to which said plunger cuts two lengths of wire with one being ejected through the cross bore and the other constituting a pin blank seating in said longitudinal bore as blocked by said plunger in its forward position.

4. Apparatus as defined in claim 3 wherein said first anvil member is fixed and said second anvil member is reciprocable with respect to the first, and further including wire feed means operable to advance said wire stock through said longitudinal bore in said first anvil member a distance such that the pin blank cut therefrom by operation of said plunger will project beyond said first anvil member for insertion through said circuit board hole and reception in said closed end hole in said second anvil member on movement thereof toward said first anvil member.

5. Apparatus as defined in claim 4 including reversible actuator means coupled to said second anvil member, to said plunger and to said wire advance means; said actuator when energized in one direction being operative first to drive said plunger from its retracted to its forward position to cut a pin blank and to provide containment for one end thereof, and operative then to drive said second anvil member into engagement with the other end of said pin blank to provide containment therefor and to compress the pin blank with its ends thus contained; said actuator when energized in the reverse direction being operative first to retract said second anvil member and then to drive said wire advance means to feed another length of wire through said first anvil member.

6. Apparatus as defined in claim 5 further comprising control means for said actuator including sensor means responsive to presence of a circuit board in position for setting of a pin therein for initiating an operating cycle and energizing said actuator in said one direction.

7. An interface pin machine for fixing interface connecting pins in electrical circuit boards, comprising:
- (a) wire supply means providing pin stock from which pin blanks may be cut;
- (b) a first anvil member including a blind hole of diameter such as to receive an end of said pin blank and to contain radial expansion thereof;
- (c) a second anvil member including a through bore aligned with said blind hole in said first anvil member and a cross bore intersecting said through bore and of at least equal diameter;
- (d) wire cutting plunger means reciprocable in said cross bore between a retracted position in which the plunger unblocks said through bore to permit wire feed therethrough and a forward position in traveling to which said plunger cuts two lengths of wire with one being ejected through the cross bore and the other constituting a pin blank having an end contained within said through bore and seating against said plunger; and
- (e) means for reciprocably moving said anvil members toward each other to compress said pin blank therebetween and thus to expand its center portion radially outwardly into engagement with the surrounding walls of said circuit board.

References Cited

UNITED STATES PATENTS 2,970,370 2/1961 Weaver et al.
2,978,800 4/1961 Blain ---------------- 29—203
3,200,481 8/1965 Lenders.

THOMAS H. EAGER, Primary Examiner

U.S. Cl. X.R.

29—203